US007584068B2

(12) United States Patent
Xu

(10) Patent No.: US 7,584,068 B2
(45) Date of Patent: Sep. 1, 2009

(54) ELECTRICALLY STIMULATED FINGERPRINT SENSOR TEST METHOD

(75) Inventor: Fang Xu, Auburndale, MA (US)

(73) Assignee: Teradyne, Inc., North Reading, MA (US)

( * ) Notice: Subject to any disclaimer, the term of this patent is extended or adjusted under 35 U.S.C. 154(b) by 202 days.

(21) Appl. No.: 11/677,690

(22) Filed: Feb. 22, 2007

(65) Prior Publication Data

US 2008/0208495 A1    Aug. 28, 2008

(51) Int. Cl.
G01C 25/00    (2006.01)
(52) U.S. Cl. ...................................................... 702/104
(58) Field of Classification Search .................... 702/52, 702/57, 58, 59, 64, 81, 90–93, 97, 104, 116, 702/118, 170, 182–185, 189, 193; 324/661, 324/662; 73/862.68, 862.474; 257/124, 257/415, 417
See application file for complete search history.

(56) References Cited

U.S. PATENT DOCUMENTS

| 5,325,442 | A | * | 6/1994 | Knapp ........................ 382/124 |
| 5,373,181 | A | * | 12/1994 | Scheiter et al. ............. 257/415 |
| 6,234,031 | B1 | * | 5/2001 | Suga ...................... 73/862.474 |
| 6,330,345 | B1 | | 12/2001 | Russo et al. ................ 382/115 |
| 6,362,633 | B1 | * | 3/2002 | Tartagni ..................... 324/662 |
| 6,693,441 | B2 | * | 2/2004 | Lane et al. .................. 324/662 |
| 2001/0025532 | A1 | * | 10/2001 | Kramer ................... 73/862.68 |
| 2003/0016849 | A1 | * | 1/2003 | Andrade ..................... 382/124 |
| 2005/0174128 | A1 | * | 8/2005 | Kim et al. ................... 324/661 |
| 2006/0138574 | A1 | * | 6/2006 | Saito et al. .................. 257/417 |
| 2008/0069413 | A1 | * | 3/2008 | Riedijk et al. .............. 382/124 |

FOREIGN PATENT DOCUMENTS

| EP | 0 846 955 | 6/1998 |
| WO | WO99/26187 | 5/1999 |

OTHER PUBLICATIONS

International Search Report and Written Opinion in Application No. PCT/US2008/54382, dated Jul. 10, 2008.
Morimura et al., "A Pixel-Level Automatic Calibration Circuit Scheme for capacitive Fingerprint Sensor LSIs", IEEE Journal of Solid-State Circuits, vol. 37(10), pp. 1300-1306 (2002).

* cited by examiner

*Primary Examiner*—Edward Raymond
*Assistant Examiner*—Mohamed Charioui
(74) *Attorney, Agent, or Firm*—Fish & Richardson P.C.

(57) ABSTRACT

Systems and techniques for testing a fingerprint sensor are described. A conductive material is placed on a surface of the fingerprint sensor, and an electrical signal is applied to the conductive material. The electrical signal affects a first electrical property associated with first and second electrodes of the fingerprint sensor. First and second measurements of a second electrical property associated with the first and second electrodes are acquired, the second electrical property being correlated to the first electrical property. The first and second measurements are analyzed to determine whether the fingerprint sensor has one or more defects.

18 Claims, 4 Drawing Sheets

ELECTRICALLY STIMULATED FINGERPRINT SENSOR TEST METHOD

TECHNICAL FIELD

This patent application relates to device testing and, more particularly, to testing fingerprint sensor devices.

BACKGROUND

Fingerprints are one of many forms of biometrics used to identify an individual and to verity their identity. The analysis of fingerprints for matching purposes generally requires the comparison of several features of the fingerprint pattern. Fingerprint authentication often involves the use of a fingerprint sensor to capture a digital image of a fingerprint pattern. The digital image may then be compared to previously stored templates of fingerprints for authentication purposes.

SUMMARY

This application describes systems and methods, including computer program products, for testing a fingerprint sensor.

In general, in one aspect, the application describes automatic test equipment for testing a fingerprint sensor. The automatic test equipment includes a testing device communicatively coupled to a conductive material associated with the fingerprint sensor and a processing device communicatively coupled to the testing device. The testing device is configured to apply an electrical signal to the conductive material, the electrical signal for affecting a first electrical property associated with first and second electrodes of the fingerprint sensor, and acquire first and second measurements of a second electrical property associated with the first and second electrodes, the second electrical property being related to the first electrical property. The processing device is configured to execute instructions to determine that the fingerprint sensor has a defect based on an analysis of the first and second measurements.

In general, in another aspect, the application also describes a method and a computer program product for testing a fingerprint sensor. The method includes placing a conductive material over a surface of the fingerprint sensor; applying an electrical signal to the conductive material, the electrical signal affecting a first electrical property associated with first and second electrodes of the fingerprint sensor; acquiring first and second measurements of a second electrical properly associated with the first and second electrodes, the second electrical property being related to the first electrical property; and determining that the fingerprint sensor has a defect based on an analysis of the first and second measurements.

In general, in a further aspect, the application also describes a fingerprint sensor that includes an array of electrodes (e.g., over a planar or carved surface); an electrically insulating material over a surface of the electrodes; and an electrically conductive material over the insulating material, the conductive material being configured to receive an electrical test signal for affecting an electrical property of the electrodes, the electrical property being usable to detect a defect in the fingerprint sensor.

Embodiments may include one or more of the following. The applied electrical signal may include a voltage. The first electrical property may be a voltage or a time-derivative thereof and the second electrical property may be a capacitance. A difference between the first and second measurements may be obtained from a comparison of the first and second measurements; and a presence of a defect of the fingerprint sensor may be determined based on the difference. For example, the presence of a defect may be determined if the difference is greater than a predetermined threshold. The conductive material may include a metallic foil attached to a top surface of the fingerprint sensor using a tear-off adhesive. Defect may include one or more of: non-uniform spacings between two or more of the electrodes, irregular geometries of one or more of the electrodes, a short between electrodes, and irregularity of the thickness of the insulating material. The electrical property of the electrodes may be a voltage or a current (or time-derivatives or integrals thereof), and the conductive material, the insulating material, and an electrode of the array form a capacitor having a capacitance that is related to the electrical property. The processing device may be further configured to determine which electrodes are defective based on measurements of the electrical property.

One or more embodiments may provide one or more of the following advantages. The fingerprint sensor can be tested after manufacture but before it is shipped to customers. A conductive foil protects the electrode array of the fingerprint sensor during transportation and final assembly of the fingerprint sensor. The conductive foil can easily be peeled off by the end user before use. Sources of defects, including individual defective electrodes can be identified.

The details of one or more embodiments are set forth in the accompanying drawings and the description below. Other features, objects, and advantages will be apparent from the description and drawings, and from the claims.

DETAILED DESCRIPTION

Capacitance fingerprint sensors use capacitance measurements acquired from a finger to form images of a fingerprint pattern. The skin of a finger includes an electrically conductive internal layer (referred to as the "dermal layer") and an outer non-conductive layer (referred to as the "epidermal layer"). The contours of both the dermal and epidermal layers exhibit the same characteristic fingerprint pattern.

A capacitance fingerprint sensor typically includes a matrix of electrodes attached to a planar surface. During a fingerprint scan operation, the electrodes form a capacitor with a finger in close proximity, much like a parallel plate capacitor. The sensor electrodes each act as one plate of a parallel-plate capacitor, the dermal layer, which is electrically conductive, acts as the other plate, and the non-conductive epidermal layer acts as a dielectric. A parallel-plate capacitor has the following known relationships:

(1) $V=Q/C$, where V is the voltage potential; C is the capacitance; and Q is the charge; and (2) $C=(k\epsilon_0 \times A)/d$, where k is a dielectric constant of the material(s) between the plates, $\epsilon_0$ is the permittivity of free space; A is the area of each plate; and d is the separation between the plates.

Just as the capacitance between two parallel plates is inversely proportional to the distance between the plates, electrodes positioned closest to the finger (e.g., underneath the ridges of the fingerprint) form larger capacitances than those that are positioned farther away (e.g., under the valleys that lie between the ridges of the fingerprint. By analyzing the capacitance sensed at each electrode in relation to the electrode's geometric position within the array, an image of the fingerprint can be constructed.

Figure 1A:
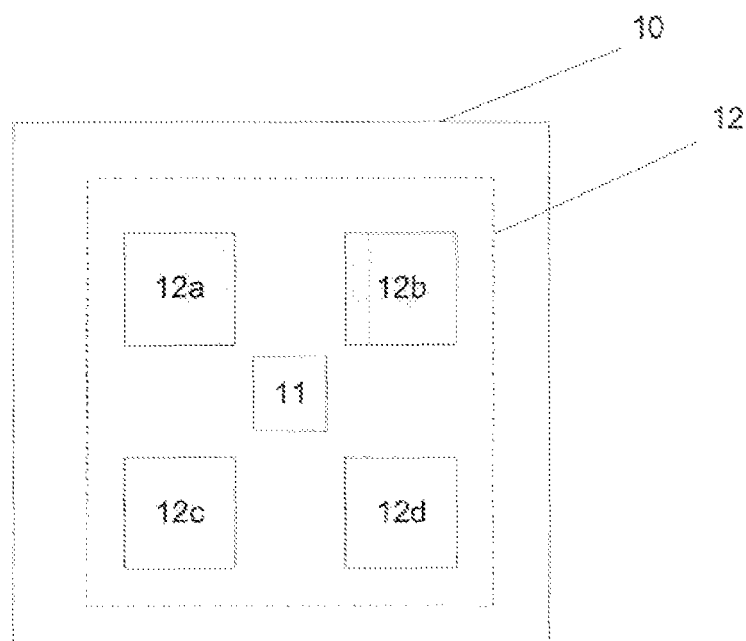
FIGS. 1A and 1B are block diagrams showing different view of a fingerprint sensor.
Figure 1B:
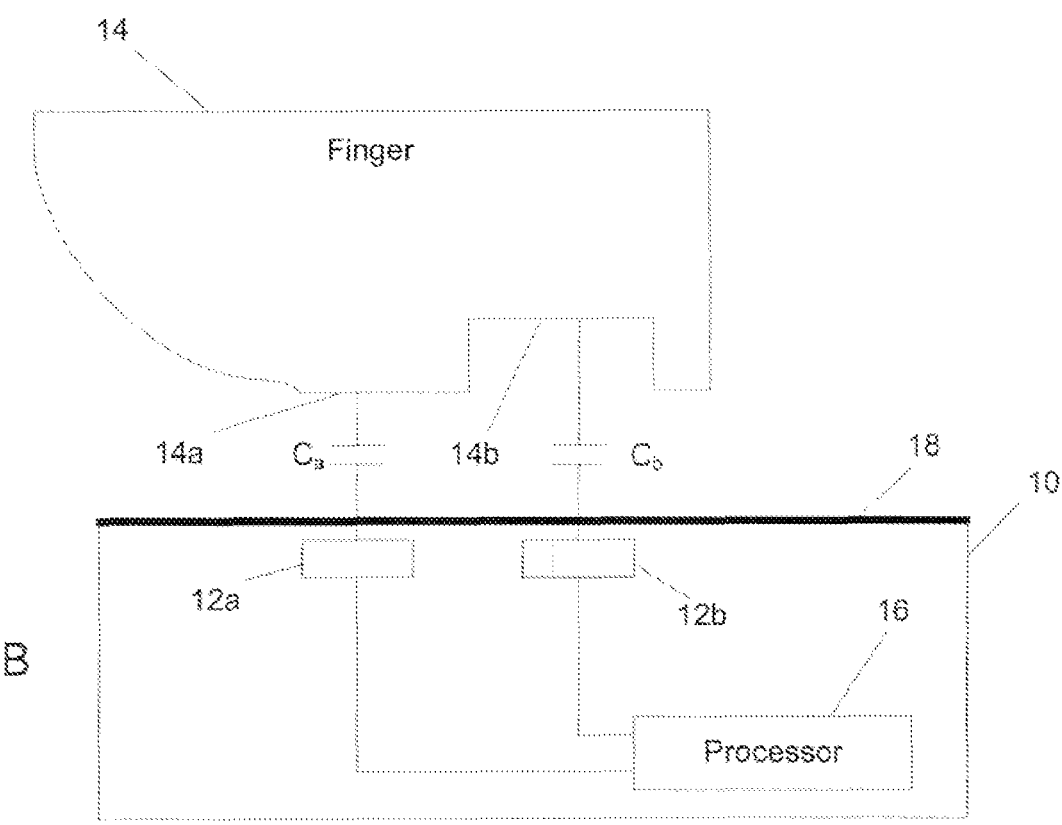

Referring to FIGS. 1A and 1B, different views of a capacitance fingerprint sensor 10 are shown. FIG. 1A shows a top view of the fingerprint sensor 10, and FIG. 1B shows a side view of the fingerprint sensor 10. The fingerprint sensor 10 includes an array of electrodes 12a-d (collectively referred to as "electrode array 12" or "electrodes 12"). Although only four electrodes are shown in FIG. 1A, in practice, the fingerprint sensor 10 may have more electrodes (e.g., 25 or more). The electrodes may have the same or similar dimensions and may be spaced approximately equidistant from each other to form a grid-like array. The fingerprint sensor 10 includes an insulating layer 18 disposed over the electrode array 12 to prevent a finger tip 14 from coming into direct contact with the electrodes 12. The insulating layer 18 primarily serves to protect the electrodes 12 from damage. The fingerprint sensor optionally includes a ground contact 11 that electrically grounds a finger in contact with the electrode array 12.

As shown in FIG. 1B, when a finger tip 14 is brought into contact or close proximity to the electrode array 12, each of the electrodes 12 acts as one plate of a parallel-plate capacitor. The electrically conductive layers on or below the surface of the finger tip (e.g., the dermal layer) act as the other plate, and the non-conductive layer(s) of the finger tip (e.g., the epidermal layer) and the insulating layer 18 acts as a dielectric between the plates. Each of the electrodes 12 measures the capacitance formed between itself and the finger tip 14. The capacitance sensed by an electrode depends on the distance between it and the surface of the finger tip 14. For example, a capacitance $C_a$ formed between a ridge 14a of the fingerprint and the electrode 12a is higher than a capacitance $C_b$ formed between a valley 14b of the fingerprint and the electrode 12b. The electrode or the finger may be electrically grounded.

The fingerprint sensor 10 includes a processor 16 that is communicatively coupled to each of the electrodes 12. The processor 16 receives the measured capacitance values from the electrodes 12 and uses these measurements, along with the known geometry of the electrode array 12, to determine the locations of fingerprint ridges and valleys. The geometry of the electrode array 12 may include the dimensions of the electrodes 12, the locations of electrodes on the array (e.g., absolute and/or relative), and the number of electrodes included in the array 12. When analyzing the capacitance measurements, the processor 16 may use preprogrammed dielectric constants associated with layers of the fingertip 14 and/or insulating layer 18 to determine the existence of valleys and ridges and to construct a digital image of the fingerprint therefrom.

In some embodiments, the fingerprint sensor 10 includes a voltage source (not shown) that applies a voltage to the finger tip 14 before the electrodes 12 acquire capacitance measurements. The application of voltage charges the effective capacitors formed between the electrodes 12 and the finger tip 14 such that an electric field between the finger and electrode array 12 follows the pattern of the ridges and valleys in the dermal skin layer. After charging, the capacitors are allowed to discharge. During discharge, voltages between the dermal layer and the electrodes are measured. From the measured voltages, the processor 16 determines the capacitances formed between the electrodes and the dermal layer using known relationships between voltage and capacitance. Using known relationships between parallel plate capacitance and the distance between two parallel plates, the processor 16 forms an image of the fingerprint from the determined capacitance values. In some embodiments, currents between the dermal layer and the electrodes are measured. In these embodiments, the processor 16 determines the capacitances formed between the electrodes and the dermal layer using known relationships between current and capacitance. Using the determined capacitances and known physical properties of a parallel plate capacitor, the processor 16 forms an image of the fingerprint.

Capacitance fingerprint sensors, such as fingerprint sensor 10, may have various defects that can result in inaccurate fingerprint readings. Examples of defects include misalignment of electrodes (e.g., misalignment within the array grid and/or along the plane parallel to the surface of the sensor), irregular electrode geometries (e.g., one or more dimensions of an electrode are bigger or smaller than an acceptable value), shorts between two or more electrodes, thickness irregularities of the insulating material, and other defects that would cause inaccurate fingerprint readings. Currently, there are few if any methods for testing fingerprint sensors for defects before they are shipped customers. Often, the manufacturer relies on the customer to send notification that a fingerprint sensor is not working properly before any action is taken to either repair the faulty fingerprint sensor or replace it. Thus, it would be advantageous to verify that fingerprint sensors are working properly after they have been manufactured but before they are shipped to customers.

Figure 2:
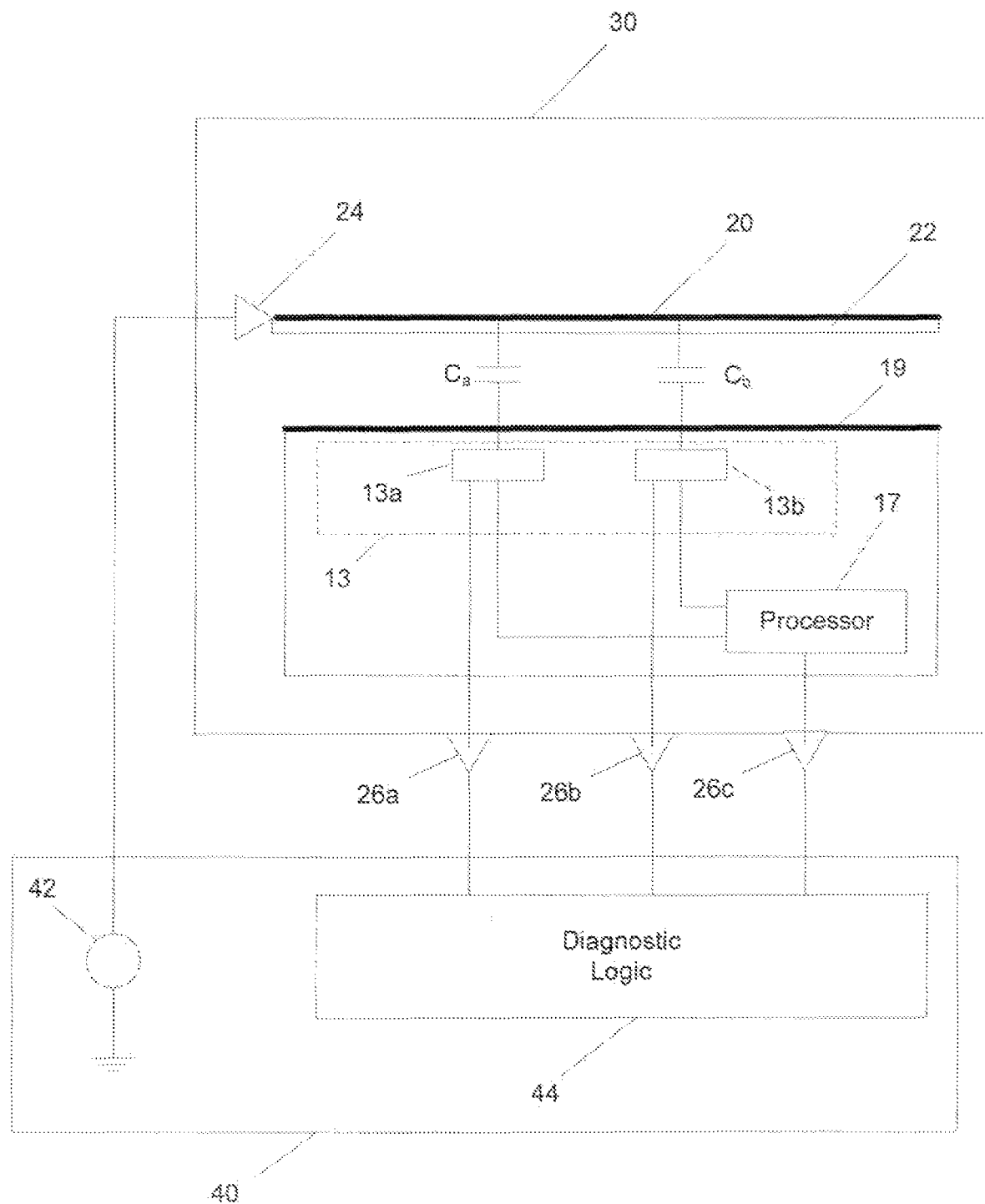
FIG. 2 is a block diagram of a fingerprint sensor and test equipment for testing the fingerprint sensor.

FIG. 2 shows a block diagram of a fingerprint sensor 30 configured to be tested using test equipment 40 after the sensor 30 has been manufactured. Like the fingerprint sensor 10 of FIGS. 1A-1B, the fingerprint sensor 30 includes an array of approximately equidistantly-spaced electrodes 13 (the side view of which is shown to include electrodes 13a-b), a processor 17, and an insulating layer 19 disposed over the electrode array 13. In some embodiments, the spacings between the electrodes 13 are non-uniform. For example, the electrodes could be positioned to form a pattern of ovals, concentric circles, and other patterns. In some embodiments, the spacings between the electrodes 13 are approximately 1 mm and the dimensions of the electrodes 13 are approximately 1 mm$^2$. In other embodiments, the spacings are less than 1 mm (e.g., 0.5 mm, 0.1 mm, 0.01 mm, etc.) and the dimensions of the electrodes 13 are approximately less than 1 mm$^2$ (e.g., 0.5 mm$^2$, 0.1 mm$^2$, 0.01 mm$^2$, etc.). In general, using smaller electrodes with smaller spacings produces fingerprint images having higher resolutions.

The electrodes 13 and processor 17 perform functions similar to those of the electrodes 12 and the processor 16 described above with respect to FIGS. 1A and 1B. The processor 17 is communicatively coupled (e.g., electrically coupled or optically coupled) to each of the electrodes 13, which measure the capacitance formed with a finger tip in close proximity. The processor 17 receives the measured capacitance values from the electrodes 13 and uses the measurements, along with the known geometry of the electrode array 13, to determine the locations of fingerprint ridges and valleys. The geometry of the electrode array 13 may include the dimensions of the electrodes 13, the locations of electrodes on the array (e.g., absolute and/or relative), and the number of electrodes included in the array 13. When analyzing the capacitance measurements, the processor 17 may use preprogrammed dielectric constants associated with layers of the fingertip and/or insulating layer 19 to determine the existence of valleys and ridges.

In some embodiments, the fingerprint sensor 30 includes a voltage source (not shown) that applies a voltage to a finger tip before the electrodes 13 acquire capacitance measurements. The application of voltage charges the effective capacitors (e.g., $C_a$ and $C_b$) formed between the electrodes 13 and the finger tip such that an electric field between the finger and electrode array 13 follows the pattern of the ridges and valleys in the dermal skin layer. After charging, the effective capacitors are allowed to discharge. In some embodiments, the voltage is applied for a predetermined time period to assure that the effective capacitors have charged. During discharge, the voltages between the dermal layer and the electrodes 13 are measured. From the measured voltages, the processor 17 determines the capacitances at each electrode and processes the capacitance values to form an image of the fingerprint.

In some embodiments, currents between the dermal layer and the electrodes are measured during discharge. In these embodiments, the processor 16 determines the capacitances formed between the electrodes and the dermal layer using known relationships between current and capacitance and processes the capacitance values to form an image of the fingerprint.

The fingerprint sensor 30 also has a packaging that includes a conductive foil 20 that is removably attached to the surface of insulating material 18 by an adhesive layer 22. The foil 20 has an electrical contact 24 for receiving an exterior electrical stimulus. The packaging also includes contacts 26a-c that are communicatively coupled to the electrodes 13a and 13b, and to the processor 17, respectively.

The testing equipment 40 includes a voltage source 42 for applying a test voltage to the electrical contact 24 of the foil 20. The test voltage may be a direct current (DC) voltage or an alternating current (AC) voltage. When the test voltage is applied to foil 20, the foil 20 forms a capacitor with the electrodes 13. During the test, the applied voltage is varied to cause the capacitors between the electrodes 13 and the foil 20 to charge and discharge. During a discharge cycle, diagnostic logic 44 measures the voltage between each electrode of the array 13 and the foil 20 and compares the measured voltages against a reference voltage to determine (e.g., calculate) the capacitances at the electrodes 13. To determine the capacitance formed between an electrode and the foil, the diagnostic logic 44 determines the charge transferred between the foil and the electrode during discharge and/or during charging. In some embodiments, the diagnostic logic 44 measures the voltages at each of the electrodes 13 directly through connections provided by contacts coupled to the electrodes 13 (e.g., contacts 26a and 26b provide connections to electrodes 13a and 13b, respectively). In these embodiments, the fingerprint sensor 30 may not include the contact 26c for providing access to the processor 17. In other embodiments, the processor 17 measures the voltages at the electrodes 13 after a test voltage is applied and sends the voltage values to the diagnostic logic 44 through a connection provided by the contact 26c. In these embodiments, the fingerprint sensor 30 may not include contacts for providing connections to individual electrodes 13 (e.g., contacts 26a and 26b may be eliminated).

For a working fingerprint sensor, the measured voltages will be approximately the same value, within a given test limit. By comparing the measured voltages to each other, taking into account a predefined tolerance, the diagnostic logic 44 can assess whether or net the fingerprint sensor 30 is working properly. By analyzing the capacitances at individual electrodes, the diagnostic logic 44 can pinpoint which electrode or group of electrodes, in particular, are defective. Furthermore, depending on the measured voltage values and/or capacitances derived therefrom, the diagnostic logic 44 may be able to determine the source of the defect (e.g., a short exists between two or more electrodes, one or more electrodes has an irregular geometry, etc.).

During manufacturing of the sensor 30, the conductive foil 20 may be attached to the top surface of the insulator 18 with an adhesive 22, such as tear-off glue. The foil 20 may be any conductive material (e.g., metal). Examples of conductive materials include aluminum, copper, metal alloys, and other conductive metals. The foil 20 itself provides a protective coat during transportation and final assembly of the sensor 30. Before use, the end user peels off the foil 20. Optionally, the action of peeling off the foil 20 may enable a series of customer agreements, such as a warranty guaranteeing the proper functioning of the sensor 30 over a predetermined period of time.

The voltage source 42 may be any source capable of providing an electrical stimulus. For example, voltage source 42 could be modified to be a current source for applying either DC current or an AC current. The diagnostic logic 44 may be implemented as one or more processors. The voltage source 42 and the diagnostic logic may be integrated together as a single device or may be separate devices.

Figure 3:
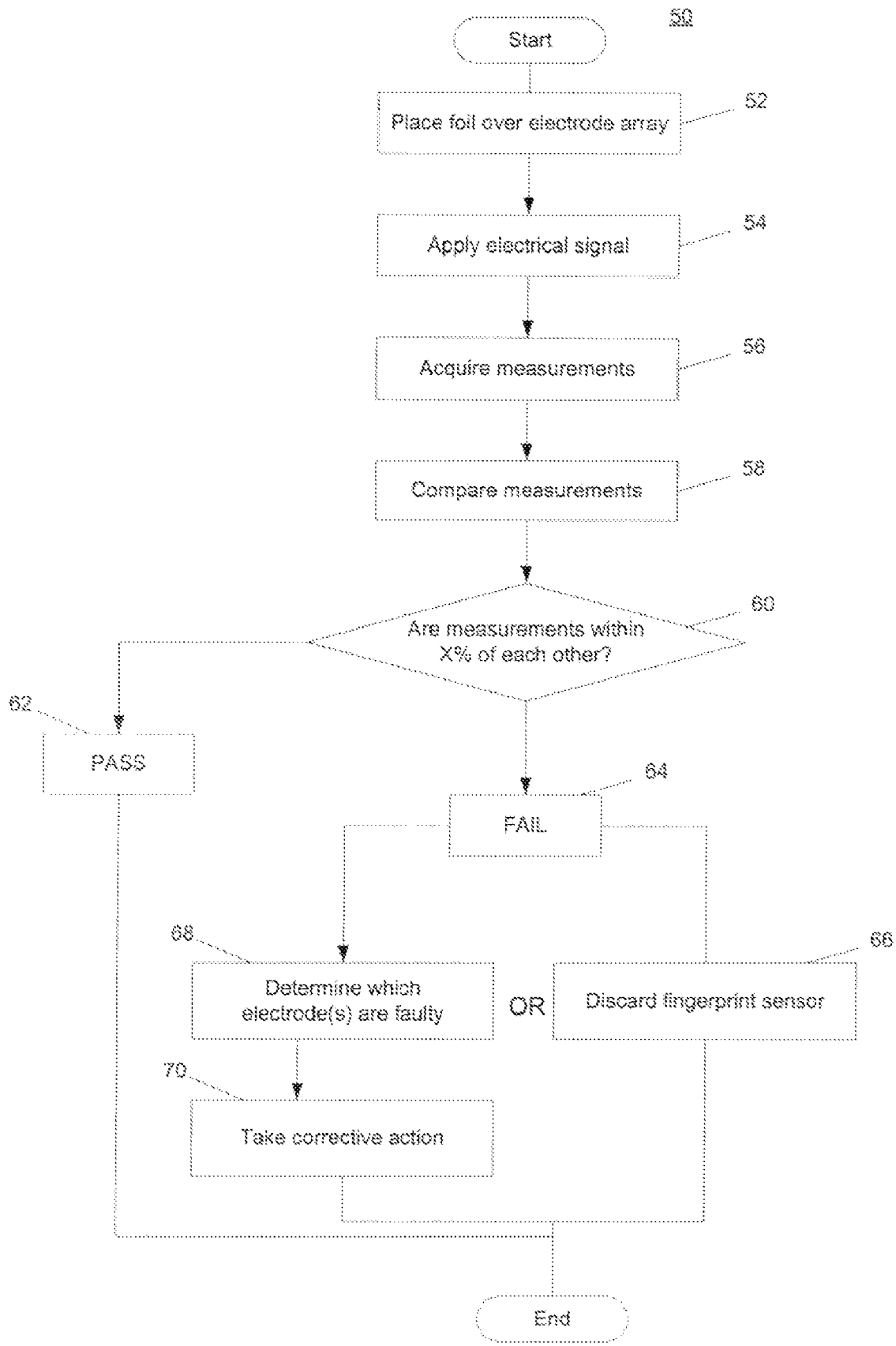
FIG. 3 is a flowchart of a process for testing the fingerprint sensor shown in FIG. 2 using the test equipment shown in FIG. 2.

Referring to FIG. 3, a process 50 for packaging the fingerprint sensor 30 and testing the sensor 30 using the testing equipment 40 is described in detail. During manufacturing, the conductive foil 20 is placed (52) over the electrode array 13, for example, the foil 20 is attached directly to the top surface of the insulating layer 18, which is disposed on top of the electrode array 13. The voltage source 42 is electronically connected to the contact 24 attached to the foil 20. An electrical signal (e.g., a voltage or current) is applied (54) to the contact 24 and conducted, by the foil 20. The resulting voltages or currents between each of the electrodes 13 and the foil 20 are measured (56) at approximately the same time as the effective capacitances between the electrodes 13 and the foil 20 charge or discharge. The resulting voltages or currents for each electrode are measured such that during the time over which the measurement is acquired the charges between the electrodes 13 and the foil 20 are nearly constant, though the charges can vary over time. In some embodiments, the process 50 measures the change in voltage or current between each of the electrodes 13 and foil 20 as a function of time.

For example, by measuring the how much the voltage between an electrode and the foil changes over a given time for a given applied current, the effective capacitance of the electrode may be determined using the following relationship:

$$I(t)=CdV(t)/dt,$$

where I(t) is the applied current, C is the capacitance of the effective capacitor formed between an electrode and the foil, and dV(t)/dt is the time derivative of the voltage across the effective capacitor. The time derivative represents how much the voltage between an electrode and the foil changes over a given time period. If one knows the applied current as function of time and measures dV(t)/dt, the capacitance C may be determined using the above relationship.

The current may be applied directly as a current source or could be produced from an applied voltage. The effective capacitance formed between an electrode and the foil is an intrinsic property of the electrode that does not depend on the applied electrical signal.

In some embodiments, the diagnostic logic 44 measures the voltages or currents at each of the electrodes 13 directly and then calculates the capacitances based on the voltages or currents. For example, using the relationship described above, the diagnostic logic 44 may calculate the derivative of the voltage measured between an electrode and the foil and then calculate the capacitance from the derivative and from the applied current, which may be measured or known beforehand.

In other embodiments, the processor 17 within the fingerprint sensor 30 receives voltage or current measurements from the electrodes and reports these to the diagnostic logic 44.

The process 50 compares (58) the acquired measurements (e.g., voltage, current, and/or capacitance measurements) and determines (60) whether or not the measurements are all within a given percent of each other. For example, the process 50 may find a difference between two measurements (e.g., two voltage measurements) and determine whether or not the difference is within an acceptable range. The percent or range is determined based on the accuracy requirements of the application for which the fingerprint sensor is used. The higher the required accuracy, the lower the percent or acceptable range. If the differences between the measurements are determined (60) to be within an acceptable range, the fingerprint sensor 30 passes (62) as a good device and may subsequently be shipped to a customer in some embodiments, the fingerprint sensor passes if the measurements are determine to be within 10% of each other. In other embodiments, the fingerprint sensor passes if the measurements are determine to be within 1% of each other. The target percentage can vary and may be less than 1% (e.g., 0.1%, 0.01%, 0.001%, etc.). In further embodiments, the target percentage is greater than 10% (e.g., 20%, 30%, 50%, etc.).

If the differences between measurements are determined (60) to be greater than a desired value, the process 50 indicates (64) that the fingerprint sensor 30 is faulty or defective. At this point, the defective fingerprint sensor 30 may be discarded (66). Alternatively, the process 50 may analyze the measurements 68 to determine (68) the cause of the defects (e.g., which electrode(s) are faulty). For example, the process 50 may determine that one or more electrodes are defective if their corresponding measurements are above or below an average value, e.g., by a standard deviation or a multiple thereof. The process 50 may further analyze the measurements corresponding to defective electrodes to determine the source of the defects. For example, the process 50 may determine that a short exists between two or more electrodes, that one or more electrodes have irregular geometries, or that an electrode is positioned incorrectly within the array 13. For example, in some embodiments, a voltage measurement of an electrode that is higher or lower than an average of voltage measurements obtained for all or a number of the electrodes 13 may indicate that the associated electrode has an abnormally small or large area or other abnormal dimensions. As the voltage between the plates of a parallel plate capacitor is inversely proportional to the area of the plates for a constant charge between the plates, a higher voltage results from a smaller plate area and vice versa.

Similarly, a capacitance value of an electrode that is higher or lower than an average of capacitance values measured for the electrodes 13 may indicate that the associated electrode has an abnormally large or small area or other abnormal dimensions. As the capacitance between the plates of a parallel plate capacitor is directly proportional to the area of the plates, a higher capacitance results from a larger plate area and vice versa.

A lower than usual voltage (e.g., a zero voltage) measured for a particular electrode may indicate that the electrode is shorted to another electrode. After the defective electrodes are located, the process 50 takes (70) corrective action to either repair or to replace the defective electrodes. In some embodiments, the corrective action includes programming the processor 17 to adjust a measured value according to a prescribed routine. For example, if a particular electrode is determined to be less sensitive, the processor 17 may be programmed to adjust the voltage or capacitance measured at the less-sensitive electrode by a predetermined gain factor. The refurbished fingerprint sensor 30 may be tested again by the testing process 50 before being shipped to customers.

Figure 4:
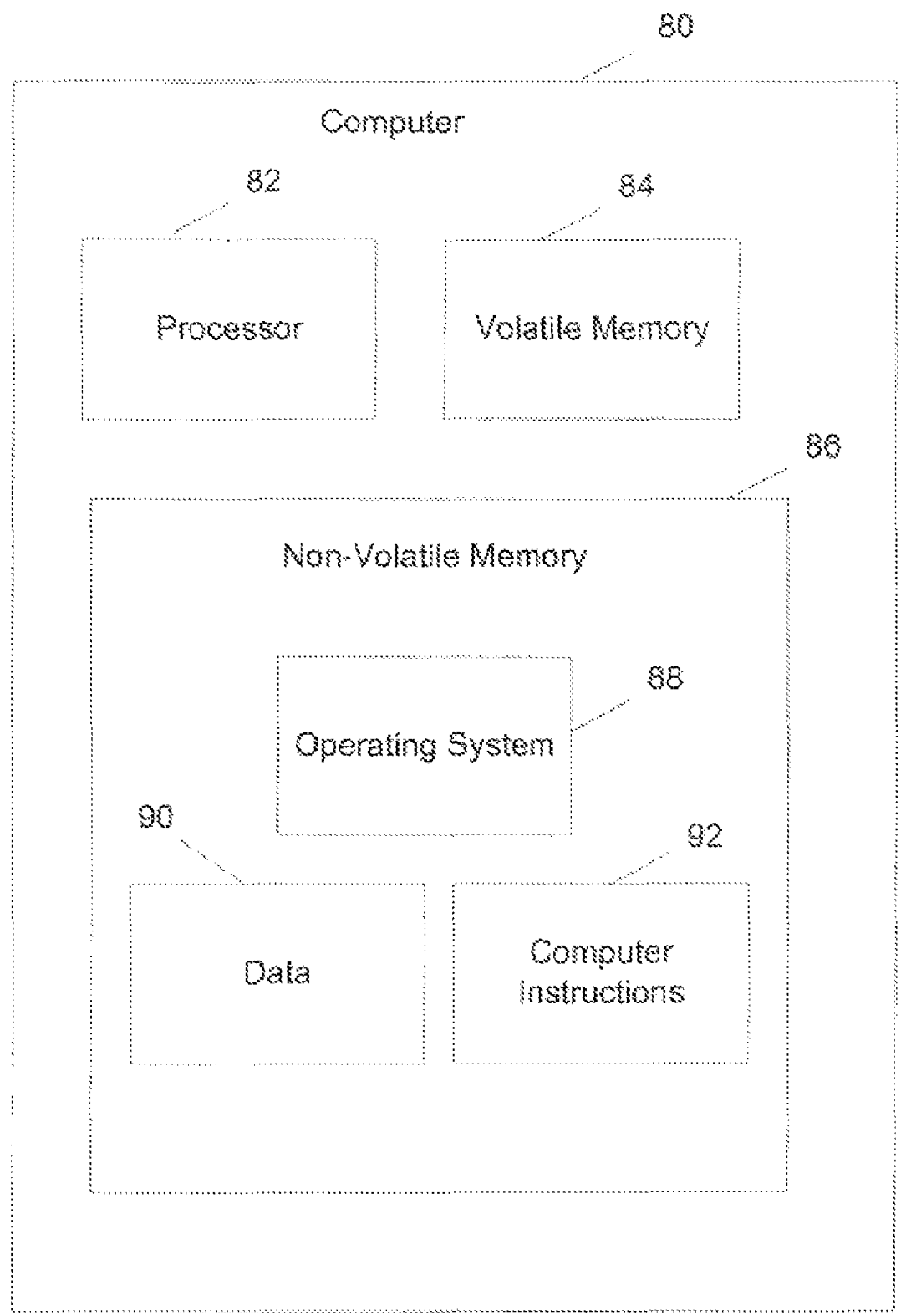
FIG. 4 is a block diagram of a computer for implementing at least part of the process shown in FIG. 3.

FIG. 4 shows a computer 80 for performing at least some steps of the testing process 50 (FIG. 3). The computer 80 includes a processor 82, a volatile memory 84, and a non-volatile memory 86 (e.g., hard disk). The non-volatile memory 86 stores operating system 88, data 90, and computer instructions 92 which are executed by the processor 82 out of the volatile memory 84 to perform the process 50.

The process 50 is not limited to use with the hardware and software described herein. The process 50 can be implemented in digital electronic circuitry, or in computer hardware, firmware, software, or in combinations thereof.

The process 50 can be implemented, at least in part, via a computer program product, i.e., a computer program tangibly embodied in an information carrier, e.g., in a machine-readable storage device or in a propagated signal, for execution by, or to control the operation of, data processing apparatus, e.g., a programmable processor, a computer, or multiple computers. A computer program can be written, in any form of programming language, including compiled or interpreted languages, and it can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a communication network.

Actions associated with implementing the process 50 can be performed by one or more programmable processors executing one or more computer programs to perform the functions of the processes. All or part of the process 50 can be implemented as, special purpose logic circuitry, e.g., an FPGA (field programmable gate array) and/or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only memory or a random access memory or both. Elements of a computer include a processor for executing instructions and one or more memory devices for storing instructions and data.

The circuitry described herein, including the voltage source 42 and the diagnostic logic 44 may be integrated as automatic test equipment or as separate circuitry for use in conjunction with automatic test equipment. The diagnostic logic 44 may be implemented using the computer 80 (FIG. 4) or as one or more processors.

A number of embodiments have been described. Nevertheless, it should be understood that various modifications may be made. For example, other electrical properties besides voltage and capacitance (e.g. could be measured at the electrodes and used to determine whether a fingerprint sensor is defective. The surface of the electrode array may be planar or curved. Accordingly, other embodiments, include those not specifically described herein, are within the scope of the following claims.

What is claimed is:

1. A method for testing a fingerprint sensor, the method comprising:
   placing a conductive material over a surface of the fingerprint sensor;
   applying an electrical test signal to the conductive material, the electrical test signal affecting a first electrical property associated with first and second electrodes of the fingerprint sensor;
   acquiring first and second measurements of a second electrical property associated with the first and second electrodes, the second electrical property being related to the first electrical property; and
   determining that the fingerprint sensor has a defect based on an analysis of the first and second measurements.

2. The method of claim 1, wherein determining comprises: comparing the first and second measurements.

3. The method of claim 2, wherein comparing comprises:
   obtaining a difference between the first and second measurements; and
   determining that the difference is greater than a predetermined threshold.

4. The method of claim 1, wherein applying an electrical test signal comprises applying a voltage.

5. The method of claim 1, wherein the first electrical property comprises voltage and the second electrical property comprises capacitance.

6. The method of claim 1, wherein the conductive material comprises a metallic foil.

7. The method of claim 1, wherein placing the conductive material comprises:
   attaching the conductive material to a top surface of the fingerprint sensor using a tear-off adhesive.

8. A fingerprint sensor comprising:
   an array of electrodes;
   an electrically insulating material over a surface of the electrodes; and
   a continuously electrically conductive layer removably attached to the insulating material, the conductive material being configured to receive an electrical test signal for affecting an electrical property of the electrodes, the electrical property being usable to detect a defect in the fingerprint sensor.

9. The fingerprint sensor of claim 8, wherein the conductive layer is a removable metallic foil affixed to the insulating layer with a layer of tear-off adhesive.

10. The fingerprint sensor of claim 8, wherein the electrical test signal comprises one of a DC voltage and an AC voltage.

11. The fingerprint sensor of claim 8, wherein the electrical property of the electrodes comprises one of a voltage and a current, and wherein the conductive layer, the insulating material, and an electrode of the array form a capacitor having a capacitance that is related to the electrical property.

12. The fingerprint sensor of claim 8, wherein the defect comprises one or more of: non-uniform spacings between two or more of the electrodes, irregular geometries of one or more of the electrodes, a short between electrodes, and irregularity of the thickness of the insulating material.

13. The fingerprint sensor of claim 8, wherein electrodes in the array of electrodes are configured to produce a capacitance with a finger in close proximity to the electrodes.

14. Automatic test equipment for testing a fingerprint sensor, the automatic test equipment comprising:
   a testing device communicatively coupled to a conductive material associated with the fingerprint sensor, the testing device configured to:
      apply an electrical signal to the conductive material, the electrical signal for affecting a first electrical property associated with first and second electrodes of the fingerprint sensor, and
      acquire first and second measurements of a second electrical property associated with the first and second electrodes, the second electrical property being related to the first electrical property; and
   a processing device communicatively coupled to the testing device, the processing device configured to execute instructions to:
      determine that the fingerprint sensor has a defect on the basis of a difference between the first and second measurements exceeding a predetermined threshold.

15. The automatic test equipment of claim 14, wherein the electrical signal comprises a voltage.

16. The automatic test equipment of claim 14, wherein the first electrical property comprises voltage and the second electrical property comprises capacitance.

17. The automatic test equipment of claim 14, wherein the conductive material comprises a metallic foil.

18. The automatic test equipment of claim 14, wherein the processing device is further configured to:
   determine that the first electrode is defective.

* * * * *